(12) United States Patent
Xiao et al.

(10) Patent No.: US 12,265,292 B2
(45) Date of Patent: Apr. 1, 2025

(54) DISPLAY MODULE AND SEAMLESS SPLICING DISPLAY DEVICE

(71) Applicant: TCL China Star Optoelectronics Technology Co., Ltd., Guangdong (CN)

(72) Inventors: Juncheng Xiao, Guangdong (CN); Bin Zhao, Guangdong (CN); Ji Li, Guangdong (CN); Hongquan Wei, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/621,252

(22) PCT Filed: Dec. 10, 2021

(86) PCT No.: PCT/CN2021/137117
§ 371 (c)(1),
(2) Date: Dec. 21, 2021

(87) PCT Pub. No.: WO2023/065488
PCT Pub. Date: Apr. 27, 2023

(65) Prior Publication Data
US 2024/0036374 A1 Feb. 1, 2024

(30) Foreign Application Priority Data
Oct. 22, 2021 (CN) .......................... 202111230577.8

(51) Int. Cl.
*G02F 1/1333* (2006.01)
*G02F 1/1362* (2006.01)
*H05K 1/18* (2006.01)

(52) U.S. Cl.
CPC .... *G02F 1/13336* (2013.01); *G02F 1/133388* (2021.01); *G02F 1/136209* (2013.01);
(Continued)

(58) Field of Classification Search
CPC .......... H05K 2201/10136; H05K 1/189; G02F 1/136286; G02F 1/136222; G02F 1/136209; G02F 1/133388; G02F 1/13336
See application file for complete search history.

(56) References Cited

U.S. PATENT DOCUMENTS

2017/0131584 A1  5/2017 Liu et al.
2018/0173036 A1* 6/2018 Kim ................. G02F 1/133524
(Continued)

FOREIGN PATENT DOCUMENTS

CN  101593473  12/2009
CN  201374154  12/2009
(Continued)

*Primary Examiner* — Mariam Qureshi

(57) ABSTRACT

A display module and a seamless splicing display device are disclosed. The display module includes: a display panel including a central display area and a bezel area adjacent to the central display area, wherein the display panel is provided with a bezel driving circuit and an array substrate driving circuit; a compensation display component disposed on the display panel, located in the bezel area, and electrically connected with the bezel driving circuit; and a metal wiring located on a lateral surface of the display panel and connected with the bezel driving circuit and the array substrate driving circuit.

20 Claims, 6 Drawing Sheets

(52) U.S. Cl.
CPC .. *G02F 1/136222* (2021.01); *G02F 1/136286* (2013.01); *H05K 1/189* (2013.01); *H05K 2201/10136* (2013.01)

(56) References Cited

U.S. PATENT DOCUMENTS

2018/0190631 A1* 7/2018 Kim .................... G02F 1/13452
2021/0109389 A1* 4/2021 Fan ....................... G02F 1/1362

FOREIGN PATENT DOCUMENTS

| CN | 104392670 | 3/2015 |
| CN | 104464557 | 3/2015 |
| CN | 106297572 | 1/2017 |
| CN | 106842711 | 6/2017 |
| CN | 207199233 | 4/2018 |
| CN | 207353253 | 5/2018 |
| CN | 111290154 | 6/2020 |
| CN | 111708194 | 9/2020 |
| CN | 111986579 | 11/2020 |
| CN | 112014987 | 12/2020 |
| CN | 212160282 | 12/2020 |
| CN | 113393775 | 9/2021 |
| CN | 113437025 | 9/2021 |

* cited by examiner

DISPLAY MODULE AND SEAMLESS SPLICING DISPLAY DEVICE

RELATED APPLICATIONS

This application is a National Phase of PCT Patent Application No. PCT/CN2021/137117 having International filing date of Dec. 10, 2021, which claims the benefit of priority of Chinese Patent Application No. 202111230577.8 filed on Oct. 22, 2021. The contents of the above applications are all incorporated by reference as if fully set forth herein in their entirety.

FIELD AND BACKGROUND OF THE INVENTION

The present disclosure relates to the field of display technology, and more particularly, to a display module and a seamless splicing display device.

With the development of display technology, the era of 8K large-screen is coming. The demand for large-screen splicing is getting higher and higher. At present, the large screen splicing on the market is mainly categorized into LED splicing and LCD splicing. Although seamless splicing display can be achieved in LED splicing, the 8K resolution cannot be satisfied due to low LED resolution. For LCD splicing, the development of LCD technology is mature, which plays the main role of the splicing market due to low costs and high yields. However, there are bezels in the LCD display screen. After each LCD display screen is spliced to each other, there is a black splicing gap between the bezels of the adjacent LCD display screens. When the image signal is inputted, the bezel does not display, so that the image is split to affect the display effect.

SUMMARY OF THE INVENTION

For LCD displays, the narrow bezel display can be realized by compressing the bezel. At present, the smallest splicing gap in the market can be made in 0.88 mm. However, the splicing gap is still inevitable, and thus the effect of seamless splicing cannot be satisfied. Therefore, there are defects in the existing technology, which are urgent to be solved.

A display module and a seamless splicing display device are disclosed in the present disclosure, so that seamless splicing of the display device is able to be achieved.

A display module includes:
  a display panel including a central display area and a bezel area adjacent to the central display area, wherein the display panel is provided with a bezel driving circuit and an array substrate driving circuit;
  a compensation display component disposed on the display panel, located in the bezel area, and electrically connected with the bezel driving circuit; and
  a metal wiring located on a lateral surface of the display panel and connected with the bezel driving circuit and the array substrate driving circuit.

In some embodiments, the bezel driving circuit includes an electrically-conductive lead, which extends to the lateral surface of the display panel and connected with the metal wiring.

In some embodiments, the display panel includes an array substrate and a color film substrate disposed opposite the array substrate, the compensation display component and the bezel driving circuit are disposed on an outer surface of the color film substrate away from the array substrate, and the array substrate driving circuit is disposed on one side of the array substrate facing the color film substrate.

In some embodiments, the compensation display component includes a plurality of small-sized light-emitting units and a plurality of sets of positive and negative electrodes, the plurality of small-sized light-emitting units and the plurality of sets of positive and negative electrodes are disposed in the bezel area, each of the small-sized light-emitting units is connected with one of the sets of positive and negative electrodes, and each of the sets of positive and negative electrodes is electrically connected to the electrically-conductive lead. The display panel includes a plurality of pixel units, a distance between centers of the adjacent pixel units is P1, a distance between one of the small-sized light-emitting units and the pixel unit closest to the central display area is P2, and P2=P1.

In some embodiments, a black matrix layer is disposed on a surface of the color film substrate close to the array substrate, the black matrix layer is located in the bezel area, and an orthogonal projection of the compensation display component projected on the color film substrate is within an orthogonal projection of the black matrix layer projected on the color film substrate.

In some embodiments, the display module includes a shielding layer, the metal wiring is divided into a bonding wiring and a non-bonding wiring, and the shielding layer is disposed on a surface of the non-bonding wiring of the metal wiring.

In some embodiments, the display module includes a flexible circuit board and a driving chip, a portion of the flexible circuit board is disposed on one side of the metal wiring away from the display panel and electrically connected with the bonding wiring, and another portion of the flexible circuit board is disposed on one side of the display panel away from the compensation display component and is electrically connected with the driving chip.

A seamless splicing display device including at least two display modules which are spliced together, wherein one of the at least two display module includes:
  a display panel including a central display area and a bezel area adjacent to the central display area, wherein the display panel is provided with a bezel driving circuit and an array substrate driving circuit;
  a compensation display component disposed on the display panel, located in the bezel area, and electrically connected with the bezel driving circuit; and
  a metal wiring located on a lateral surface of the display panel and connected with the bezel driving circuit and the array substrate driving circuit.

In some embodiments, the bezel driving circuit includes a driving part configured for driving the compensation display component and an electrically-conductive lead connected with the compensation display component, one end of the metal wiring is connected with the electrically-conductive lead, and the other end of the metal wiring is connected with the driving part.

In some embodiments, the display panel includes an array substrate and a color film substrate disposed opposite the array substrate, the compensation display component and the electrically-conductive lead are disposed on an outer surface of the color film substrate away from the array substrate, and the driving part and the array substrate driving circuit are disposed on one side of the array substrate facing the color film substrate.

In some embodiments, the compensation display component includes a plurality of small-sized light-emitting units and a plurality of sets of positive and negative electrodes, the plurality of small-sized light-emitting units and the plurality of sets of positive and negative electrodes are disposed in the bezel area, each of the small-sized light-emitting units is connected with one of the sets of positive and negative electrodes, and each of the sets of positive and negative electrodes is electrically connected to the electrically-conductive lead.

In some embodiments, the display panel includes a plurality of pixel units, a distance between centers of the adjacent pixel units is P1, a distance between one of the small-sized light-emitting units and the pixel unit closest to the central display area is P2, and P2=P1.

In some embodiments, a black matrix layer is disposed on a surface of the color film substrate close to the array substrate, the black matrix layer is located in the bezel area, and an orthogonal projection of the compensation display component projected on the color film substrate is within an orthogonal projection of the black matrix layer projected on the color film substrate.

In some embodiments, the metal wiring is L-shaped, and the metal wiring extends from the lateral surface of the display panel to a surface of the electrically-conductive lead.

In some embodiments, the display module includes a shielding layer, the metal wiring is divided into a bonding wiring and a non-bonding wiring, and the shielding layer is disposed on a surface of the non-bonding wiring of the metal wiring.

In some embodiments, the seamless splicing display device includes a flexible circuit board, a driving chip, and a protective layer, a portion of the flexible circuit board is disposed on one side of the metal wiring away from the display panel and electrically connected with the metal wiring, another portion of the flexible circuit board is disposed on one side of the display panel away from the compensation display component and is electrically connected with the driving chip, and the protective layer covers a part of a surface of the flexible circuit board and is sandwiched between the adjacent two of the display modules.

In some embodiments, the protective layer is a combination of an adhesive layer and a protective film, and the adhesive layers included in the protective layers on surfaces of the flexible circuit boards included in the spliced two of the display modules are bonded to each other.

In some embodiments, the display panel includes a plurality of pixel units, a distance between centers of the adjacent pixel units is P1, and a distance between centers of the compensation display components on the adjacent two of the display modules is P3, wherein P3=P1.

For the display module and the seamless splicing display device formed of the display modules disclosed in the present disclosure, the compensation display component is disposed in the bezel area of the display panel included in the display module, the bezel driving circuit configured for controlling the compensation display component is disposed on the surface of the display panel, the metal wiring is disposed on the lateral surface of the display panel, and the metal wiring is electrically connected with the compensation display component and the bezel driving circuit, so that the control circuit structure for the compensation display component is simplified, and the thickness of the display module is further reduced.

BRIEF DESCRIPTION OF THE SEVERAL VIEWS OF THE DRAWINGS

The technical solutions and other beneficial effects of the present disclosure are obvious by describing the specific embodiments of the present disclosure in combination with the accompanying drawings in detail.

DESCRIPTION OF SPECIFIC EMBODIMENTS OF THE INVENTION

Figure 1:
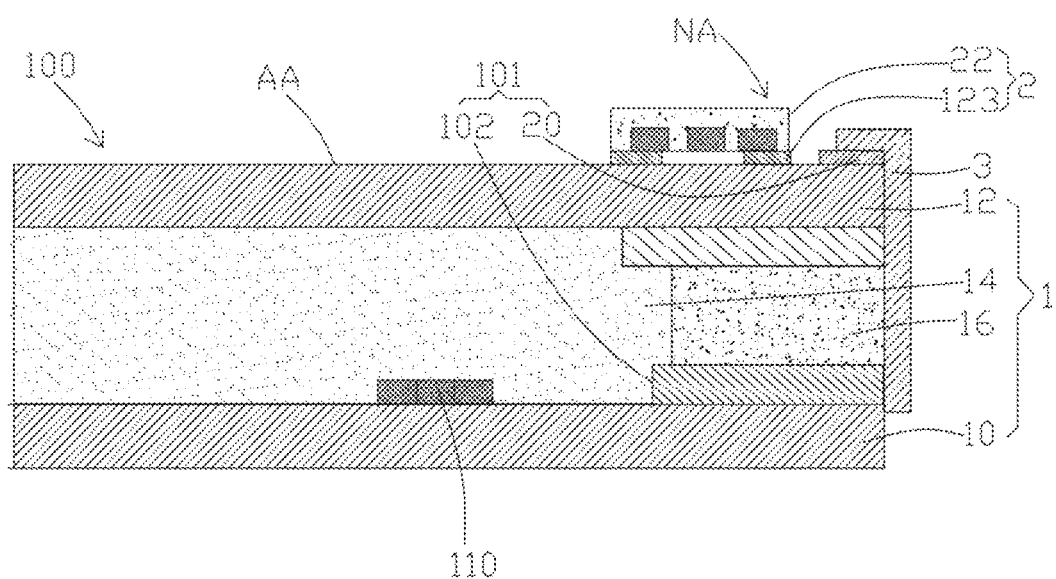
FIG. 1 is a cross-sectional structural diagram of a display module disclosed in the present disclosure.

The technical solutions in the embodiments of the present disclosure are clearly and completely described below in combination with the accompanying drawings in the embodiments of the present disclosure. Obviously, the described embodiments are only a part of the embodiments of the present disclosure rather than all of the embodiments. Based on the embodiments in the present disclosure, all other embodiments obtained by a person of ordinary skill in the art without creative efforts fall within the claim scope of the present disclosure.

In the description of the present disclosure, it should be understood that, terms such as "over" and "below", refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which should not limit the present disclosure. Moreover, terms such as "first" and "second" are used herein for purposes of description and are not intended to indicate or imply relative importance or significance. In the description of the present disclosure, "a plurality of" relates to two or more than two, unless specified or limited otherwise.

The reference numbers or reference symbols may be iterated in different examples of the present disclosure, the reiterations render the purposes of simplification and clearness, and the reiterations do not indicate the relations among every embodiment and/or disposition which are depicted.

Reference is made to FIG. 1. FIG. 1 is a display module 100 capable of realizing zero bezel disclosed in the present disclosure, and the display module 100 can be used in electronic devices. The electronic devices may be at least one of smart phones, tablet personal computers, mobile phones, video phones, e-book readers, desktop PCs, laptop PCs, netbook computers, workstations, servers, personal digital assistants, portable multimedia players, MP3 players, mobile medical machines, cameras, game consoles, digital cameras, vehicle navigators, electronic billboards, ATMs, or wearable devices.

The display module 100, in which zero bezel can be realized, includes a display panel 1, a compensation display component 2, and a metal wiring 3.

Specifically, the display panel 1 has a central display area AA and a bezel area NA. The central display area AA is an area where the pixel units of the display panel 1 generates an image. The bezel area NA is adjacent to the central display area AA and is located in a periphery of the central display area AA.

The compensation display component 2 is disposed on the display panel 1 and located in the bezel area NA. The display panel 1 is provided with a bezel driving circuit 101 configured for controlling the compensation display component 2 and an array substrate driving circuit 103 configured for driving the pixel units included in the display module 100.

The metal wiring 3 is located on a lateral surface of the display panel 1. One end thereof is connected to the bezel driving component 2, and the other end thereof is connected to the bezel driving circuit 101 and the array substrate driving circuit 103.

In the display module 100 disclosed in the present disclosure, the bezel driving circuit 101 configured for driving and controlling the compensation display component 2 is disposed on the display panel 1, the metal wiring 3 is disposed on the lateral surface of the display panel 1, the metal wiring 3 is electrically connected with the compensation display component 2 and the bezel driving circuit 101, so that the bezel driving circuit 101 is electrically connected with the array substrate driving circuit 103 which is disposed and included in the display panel 1 through the metal wiring 3. Therefore, it is unnecessary to individually attach the control circuit for the compensation display component 2, which can not only reduce the thickness of the display module 100, but also reduce the attachment deviation. Moreover, since the array substrate driving circuit 103 and the bezel driving circuit 101 are integrated, the control circuit structure of the display module 100 can be simplified.

The display module 200 is taken as an example to be described in detail below. The display module 200, in which "bezel-less" can be realized, includes a display panel 1, a compensation display module 2, a metal wiring 3, a shielding layer 4, a flexible circuit board 5, a driving chip 6, and a protective layer 7.

Figure 2:
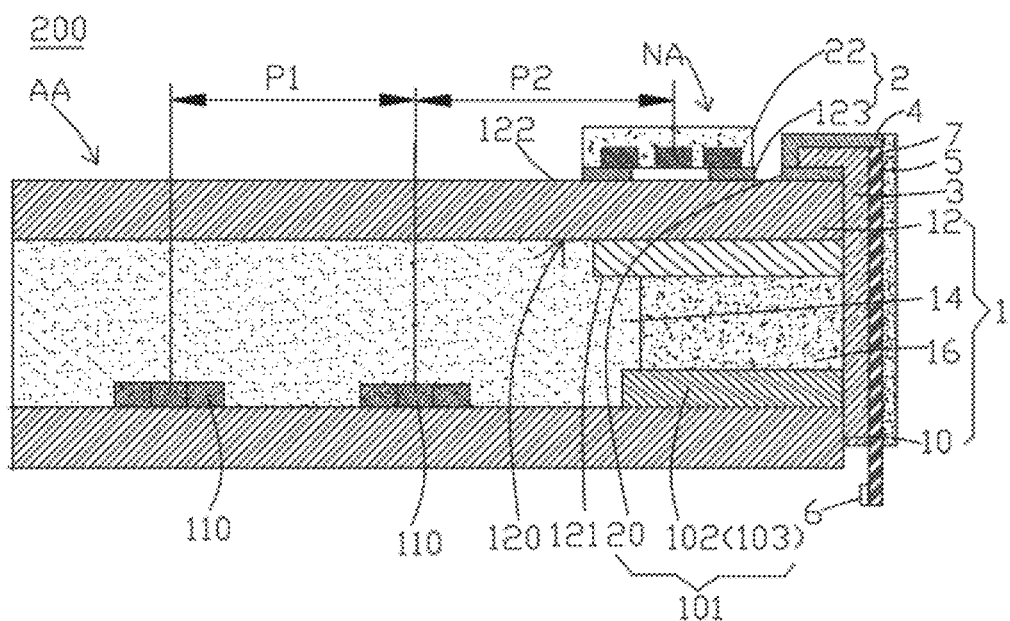
FIG. 2 is a specific cross-sectional structural diagram of a display module disclosed in the present disclosure.

Specifically, reference is made to FIG. 2. In the present disclosure, the display panel 1 is a liquid crystal display panel, which includes an array substrate 10 and a color film substrate 12 which are disposed oppositely, a liquid crystal layer 14 disposed between the array substrate 10 and the color film substrate 12, and a sealant 16 disposed around the liquid crystal layer 14.

A thin film transistor layer is formed on one side of the array substrate 10 close to the color film substrate 12, and the thin film transistor layer includes thin film transistors and the array substrate driving circuit 103 for realizing the normal display of the liquid crystal display panel.

The array substrate driving circuit 103 is configured to drive the pixel units 110 in the central display area AA for display. The pixel unit 110 may be formed by disposing the light-emitting devices with three primary colors of RGB separately on the surface of the array substrate 10, or formed of a packaging unit, which is formed of the light-emitting devices with three primary colors of RGB, on the surface of the array substrate 10. In the present embodiment, the pixel unit 110 is the packaging unit which is formed of the light-emitting devices with three primary color of RGB.

In the present embodiment, when the thin film transistor layer is formed, the bezel driving circuit 101 for driving the compensation display component 2 in the bezel area NA is also formed, which can simplify the process of the driving circuit of the compensation display component 2. The bezel driving circuit 101 includes a driving part 102, which is formed on the array substrate 10 and configured for driving the compensation display component 2, and an electrically-conductive lead 20 located on an outer surface 122 of the color film substrate 12. The bezel driving circuit 101 extends to and is aligned with the lateral surface of the display panel 1. Specifically, the electrically-conductive lead 20 extends to the lateral surface of the color film substrate 12, and the driving part 102 extends to the lateral surface of the array substrate 10. When the thin film transistor layer is formed, the driving part 102 is formed together.

The liquid crystal layer 14 is provided with liquid crystals, and the liquid crystal layer 14 may further include spacers (not shown in the figure). The array substrate 10 is configured to provide an electric field. The liquid crystals are twisted with different angles under the electric field, so that the path of light passing through the liquid crystal layer 14 is changed. Then, in combination with color filtering for light by the color film substrate 12, a color picture is shown in the display panel 1. It should be understood that the liquid crystal display panel 1 is a passive light-emitting display panel, which requires the backlight module to provide a backlight to achieve a preset luminous brightness and luminous color.

The color film substrate 12 includes an inner surface 120 facing the array substrate 10. The inner surface 120 is provided with a black matrix layer 121 and a color resist layer (not shown) formed within the black matrix layer 121. The color resist layer includes a plurality of color resists arranged in an array. The plurality of color resists can include red color resists, green color resists, and blue color resists. The red color resists filter the light passing therethrough into red, the green color resists filter the light passing therethrough into green, and the blue color resists filter the light passing therethrough into blue.

In the present embodiment, the black matrix layer 121 is located in the bezel area NA, and the position of the outer surface 122 of the color film substrate 12 corresponding to the black matrix layer 121 is configured to dispose the bezel display component 2. That is, an orthogonal projection of the compensation display component 2 projected on the color film substrate 12 is within an orthogonal projection of the black matrix layer 121 projected on the color film substrate 12. Thus, the compensation display component 2 does not occupy the space of the central display area, so that the light emitted by the pixel units 110 can be emitted all from the central display area AA.

In the present embodiment, the compensation display component 2 includes a plurality of sets of positive and negative electrodes 123 located in the bezel area NA and a plurality of small-sized light-emitting units 22 connected with the plurality of sets of positive and negative electrodes 123. Each of the sets of the positive and negative electrodes 123 needs to be electrically connected to the electrically-conductive lead 20. The small-sized light-emitting units 22 include mini-LEDs or micro-LEDs. Each of the small-sized light-emitting units 22 is a packaging unit (PKG) formed by packaging three primary color light-emitting diodes or a packaging unit formed of a monochrome light-emitting diode. The small-sized light-emitting unit 22 can be formed by surface-mount technology (SMT). Compared with the existing technology of attaching the LED light board in the bezel area NA, the thickness of the compensation display component 2 of the present disclosure is thinned, so as to reduce the thickness of the display module 200 and reduce the attachment deviation. In this way, there is no further need for narrowing the bezel of the display panel 1, so that the bezel design of the display panel 1 is simple.

In the present embodiment, the distance between centers of the adjacent pixel units 110 of the display panel 1 is P1, the distance between the small-sized light-emitting unit 22 in the bezel area NA and the pixel unit 110 closest to the central display area AA is P2, and P2=P1. In such configuration, the color of the image in the central display area AA and the image in the bezel area NA can be the same, so that the high resolution of the display module 200 can be realized.

The metal wiring 3 is located on the lateral surface of the display panel 1 for conducting the bezel driving circuit 101 and the compensation display component 2. The metal wiring 3 is electrically connected with the electrically-conductive lead 20. In the present embodiment, the metal wiring 3 is also electrically connected with the array substrate driving circuit 103. The metal wiring 3 is formed by printing conductive paste, curing, and patterning. Preferably, the metal wire 3 is a silver wire formed by curing the silver paste.

In the present embodiment, the metal wiring 3 is L-shaped. Specifically, the metal wiring 3 extends upward from an end surface of the array substrate driving circuit 103 and an end surface of the bezel driving circuit 101 to a lateral surface of the sealant 16, a lateral surface of the black matrix layer 121, and the lateral surface of the color film substrate 12 until the metal wiring 3 covers the surface of the electrically-conductive lead 20 included in the compensation display component 2, so as to realize electrical connection with the compensation display component 2.

The metal wiring 3 includes a bonding wiring (not shown) and a non-bonding wiring. The bonding wiring is configured to bond the flexible circuit board 5, and the non-bonding wiring refers to the portion of the metal wiring 3 other than the bonding wiring.

In the present embodiment, the shielding layer 4 covers the surface of the non-bonding wiring. The shielding layer 4 is configured to isolate the metal wiring 3 from water and oxygen to protect the metal wiring 3. In particular, the shielding layer 4 is black. The black shielding layer 4 is not only configured to protect the metal wiring 3, but also configured to absorb the light of the boundary to prevent the production of reflection from affecting the viewing effect. In the present embodiment, only the shielding layer 4 at the bent end of the metal wiring 3 is illustrated. It can be understood that the portion of the metal wiring 3 on the lateral surface that is not bonded with the flexible circuit board is also coated with the shielding layer 4.

In the present embodiment, a portion of the flexible circuit board is disposed on one side of the metal wiring 3 away from the display panel 1 and electrically connected with the metal wiring, and another portion of the flexible circuit board 5 is disposed on one side of the display panel 1 away from the compensation display component 2 and electrically connected with the driving chip 6.

The driving chip 6 and the control chip (not shown) are located at a remote end of the flexible circuit board 5. The driving chip 6 is configured to drive the display panel 1 and/or the compensation display module 2 for display, and the control chip is configured to control the driving chip 6.

The protective layer 7 covers the surface of the flexible circuit board 5. The protective layer 7 is configured to protect the flexible circuit board from damage during bending.

The working principle of the display module 200 is that the metal wiring 3 is disposed on the lateral surface of the display panel 1, and the array substrate 10 is electrically conducted with the compensation display component 2 disposed on the surface of the color film substrate 12 through the metal wiring 3. The surface of the metal wiring 3 is bonded with the flexible circuit board 5, and the driving chip on the flexible circuit board 5 can respectively or simultaneously drive the pixel units 110 in the central display area AA and the compensation display component 2 in the bezel area NA to display, thereby realizing the zero-bezel display of the display module 200.

Figure 3:
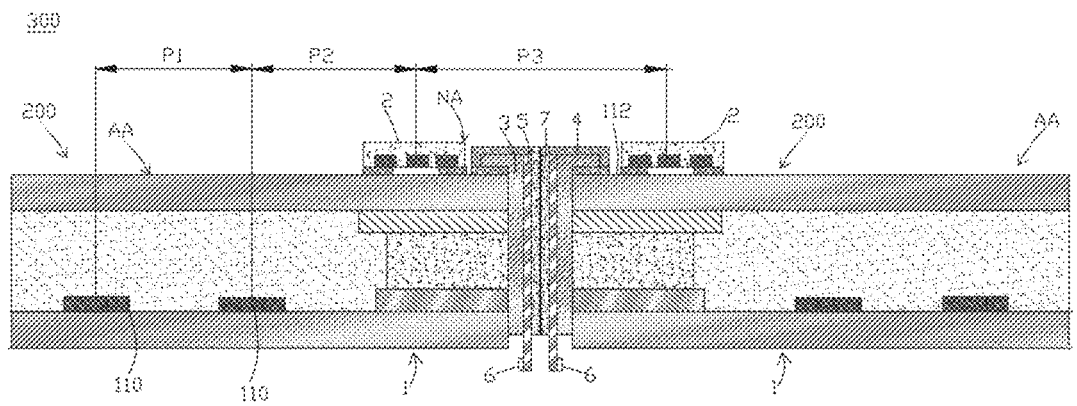
FIG. 3 is a schematic diagram of a seamless splicing display device formed of a display module disclosed in an embodiment of the present disclosure.

Reference is made to FIG. 3. A seamless splicing display device 300 is also disclosed in the present disclosure. The seamless splicing display device 300 includes a plurality of display modules 200, which are spliced with each other.

In the present embodiment, the protective layer 7 is a combination of an adhesive layer and a protective film. During splicing, the protective film included in the protective layer is removed, so that the adhesive layers included in the protective layers 7 on the surfaces of the flexible circuit boards 5 included in the spliced two of the display modules are bonded to each other. The splicing gap is sealed by the adhesive layer included in the protective layer 7, an effective water/oxygen blocking ability is achieved, so as to avoid the entry of water vapor and oxygen into the display module 200, which erode the electronic components such as positive and negative electrodes 123 inside the display module 200.

In the present embodiment, when only one column or row of the compensation display components are disposed in the bezel area NA of the display module 200, the distance between the centers of the adjacent pixel units 110 is P1, and the distance between the centers of the compensation display components 2 on the two adjacent display modules 200 is P3, wherein P3=P1. When the bezel area NA of the display module 200 is provided with more than one column or more than one row of the compensation display components 2, the distance between the centers of the nearest two of the small-sized light-emitting units 22 in the bezel area NA of the two spiced display modules 200 is P3, and P3=P1. That is, the distance between the small-sized light-emitting units 22 in the bezel area NA is equal to the distance between the centers of the pixel units 110 in the central display area AA of the display panel 1. In other words, by making the pixel spacing of the display module 200 equal to the spacing of the LEDs included in the small-sized light-emitting units 22 in the bezel area NA, the image transition tends be natural, and the real seamless splicing with same spacing can be realized.

In the present embodiment, at least one splicing edge 112 is provided in the bezel area NA. The splicing edge 112 is a side edge spiced with another display module 200. The compensation display component 2 is disposed on the surface of the splicing edge 112. It can be understood that if the display effect with zero bezel is to be realized, the compensation display component 2 can also be disposed on other edges in the bezel area NA except the splicing edge 112.

Figure 4:
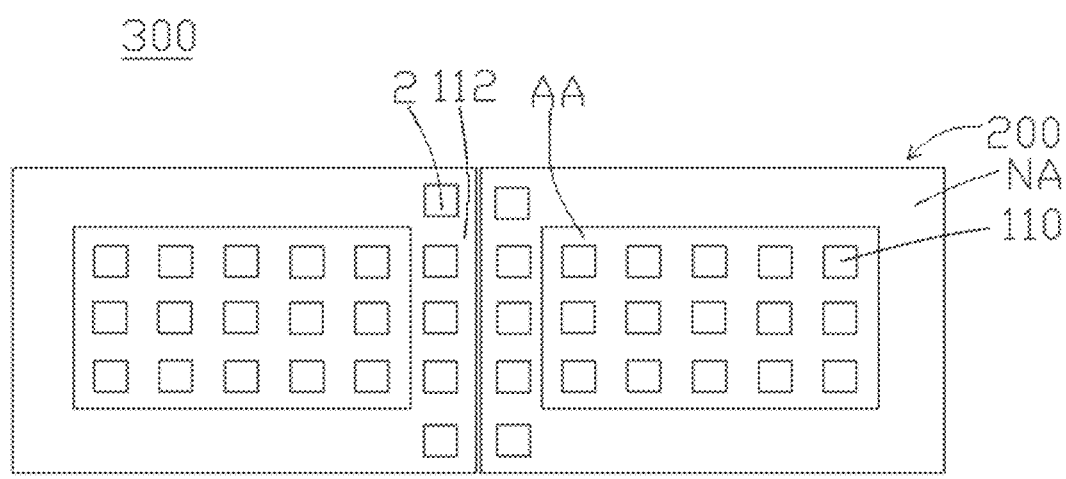
FIG. 4 is a top view of a seamless splicing display device formed of a display module disclosed in the present disclosure.

Reference is made to FIG. 4. When N×1 splicing is to be realized, each display module 200 includes one splicing edge 112, and the compensation display component 2 is disposed on the splicing edge 112 to achieve a N×1 rectangular seamless display device.

Figure 5:
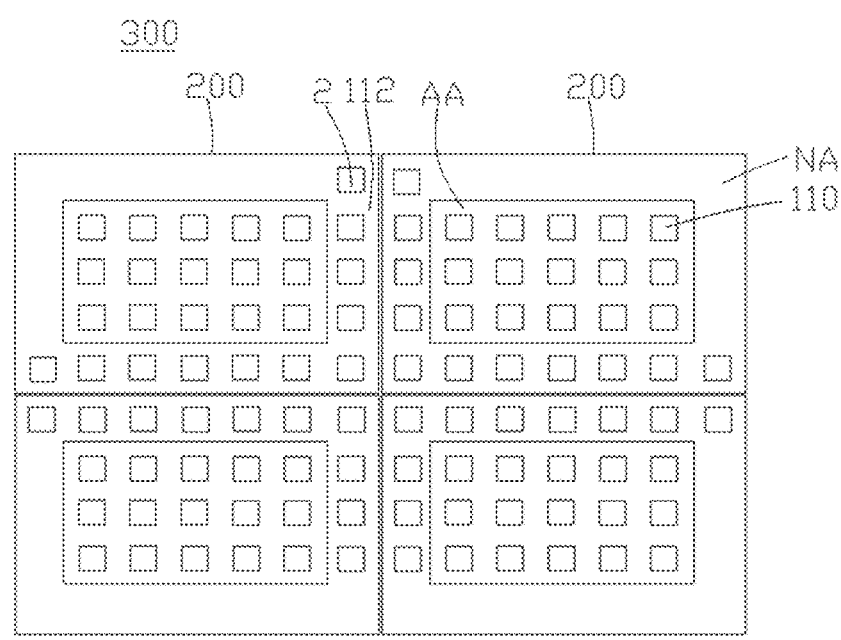
FIG. 5 is a top view of a seamless splicing display device formed by a display module disclosed in another embodiment of the present disclosure.

Reference is made to FIG. 5. When 2×2 splicing is to be realized, each display module 200 includes two splicing edges 112, and the compensation display component 2 is disposed on the surface of each of the splicing edges 112 to achieve a 2×2 square seamless display device.

When 2×3 splicing is to be realized, each of the display module 200 in the first row and the second column and the display module 200 in the second row and the second column has three splicing edges 112, and each of four peripheral display modules 200 has two splicing edges 112. The compensation display component 2 is disposed on each of the splicing edges 112 to achieve a 2×3 seamless display device.

Figure 6:
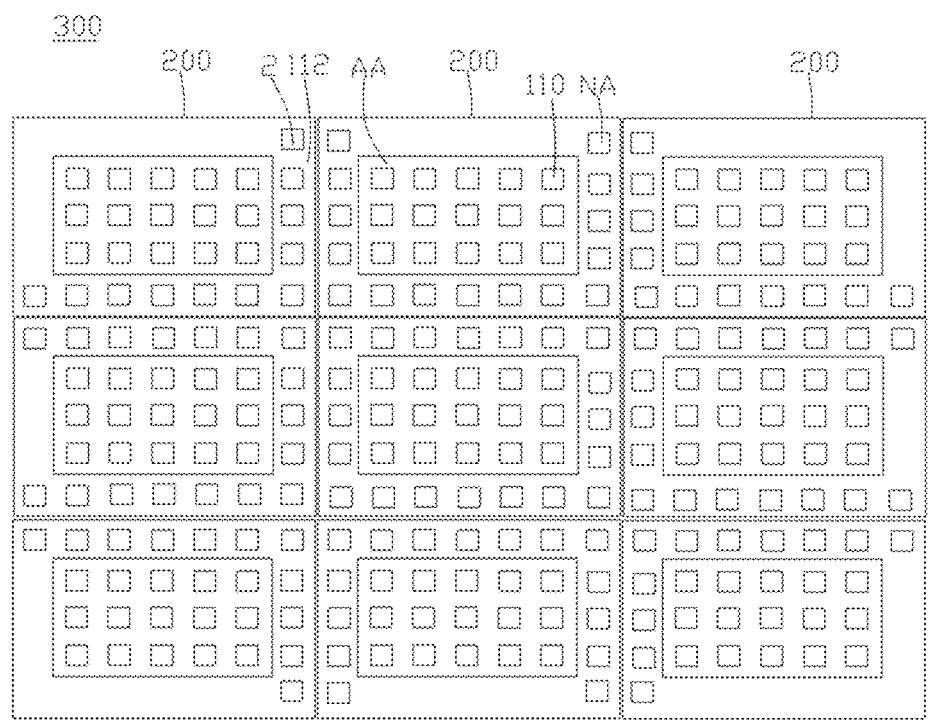
FIG. 6 is a top view of a seamless splicing display device formed by a display module disclosed in another embodiment of the present disclosure.

Reference is made to FIG. 6. When 3×3 splicing is to be realized, the display module 200 in the middle of the nine display modules 200 has four splicing edges 112, and the compensation display component 2 is disposed on each of the four splicing edges 112. Each of the four display modules 200 adjacent to the central display module 200 has three splicing edges 112, and each of the four display modules 200 at the four corners has two splicing edges 112. The compensation display component 2 is disposed on each of the splicing edges 112 to achieve a 3×3 matrix seamless display device.

In other words, the number of the splicing edges 112 required by the display module 200 can be selected according to the size of the spliced display device, so as to realize seamless splicing.

In the aforementioned embodiments, only one column of the compensation display components 2 is illustrated in the bezel area NA. In other embodiments, the bezel area NA may be provided with multiple columns of the compensation display components 2. The spacing between the compensation display components 2 in the bezel area NA is equal to the spacing between the pixel units 110 of the display panel 1.

Figure 7:
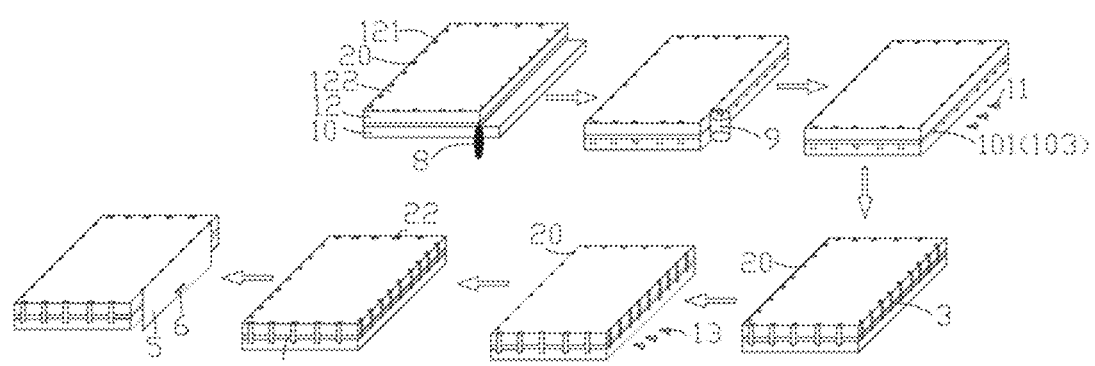
FIG. 7 is a flowchart of a manufacturing method of a seamless splicing display device disclosed in an embodiment of the present disclosure.

Reference is made to FIG. 7. A manufacturing method of a seamless splicing display device 300 is further disclosed in the present disclosure, and the method includes the following steps.

First step: an array substrate 10 is provided. The array substrate includes a thin film transistor layer, which includes thin film transistors, an array substrate driving circuit 103 for realizing normal display of the liquid crystal display panel, and a bezel driving circuit 101 for driving the compensation display component 2. In the present embodiment, the bezel driving circuit 101 and the array substrate driving circuit 103 are formed at the same time, so that there is no need to individually attach the control circuit for the compensation display component 2, which can not only reduce the thickness of the display module 100, but also reduce the attachment deviation. Moreover, since the array substrate driving circuit 103 and the bezel driving circuit 101 are integrated, the control circuit structure of the display module 100 can be simplified.

Second step: a color film substrate 12 is provided, and a plurality of sets of positive and negative electrodes 123 and an electrically-conductive lead 20 connected with the positive and negative electrodes 123 are disposed on the outer surface of the color film substrate 12 in the bezel area NA. The outer surface 122 herein refers to the surface of the color film substrate 12 away from the array substrate 10 when the display panel 1 is formed subsequently by fixing the color film substrate 12 with the array substrate 10.

Third step: an intermediate structure is formed by fixing the array substrate 10 and the color film substrate 12 with a sealant 16. A liquid crystal layer 14 and spacers are disposed between the color film substrate 12 and the array substrate 10 and inside the sealant 16.

Fourth step: the intermediate structure is cut by a cutting device 8 to expose the bezel driving circuit 101 and the array substrate driving circuit 103, so that the metal wiring 3 can be electrically connected with them later.

Fifth step: the end faces of the bezel driving circuit 101 and the array substrate driving circuit 103 are ground by a grinding device 9, and the ground surfaces are cleaned by a laser device 11 after grinding. The purpose of grinding is to control the roughness of the lateral surface of the intermediate structure to be less than 5 um, so as to facilitate the transfer of a metal wiring 3 on the lateral surface of the intermediate structure in the next step.

Sixth step: the metal wiring 3 is formed on a predetermined position on the lateral surface of the intermediate structure, and a shielding layer 4 is formed on the surface of the bending end of the metal wiring 3. The two ends of the metal wiring 3 are respectively connected with the bezel driving circuit 101 and the array substrate driving circuit 103 and the electrically-conductive lead 20. The array substrate 10 is electrically conducted with the electrically-conductive lead 20 through the metal wiring 3, and the display of the central display area AA and the display of the bezel area NA can be controlled by the driving chip on the flexible circuit board 5 subsequently. In the present embodiment, the metal wiring 3 is formed by printing conductive paste on the lateral surface of the display panel 1, curing by the curing device 13, and patterning process. Preferably, the metal wiring 3 is a silver wiring formed after curing and patterning the silver paste. Preferably, the metal wiring 3 is L-shaped. The bent end of the metal wiring 3 is formed on the surface of the electrically-conductive lead 20, and the surface of the non-bonding wiring of the metal wiring is provided with a shielding layer 4.

Seventh step: the compensation display component 2 is mounted on the positive and negative electrodes 123 in the bezel area of the outer surface 122 of the color film substrate 12 by surface-mount technology or mass transfer process, so that the small-sized light-emitting units 22 included in the compensation display component 2 are electrically connected with the electrically-conductive lead 20 on the outer surface 122 of the color film substrate 12. The small-sized light-emitting units 22 include mini-LEDs or micro-LEDs. Each of the small-sized light-emitting units 22 is a packaging unit (PKG) formed by packaging three primary color light-emitting diodes or a packaging unit formed of a monochrome light-emitting diode.

In the present embodiment, three RGB chips are packaged into one PKG. In the present embodiment, the display panel 1 includes a plurality of pixel units 110. The distance between the centers of the adjacent pixel units 110 is P1, the distance between the small-sized light-emitting unit 22 in the bezel area NA and the pixel unit 110 closest to the central display area AA is P2, and P2=P1.

Eighth step: a flexible circuit board 5 is provided, and the flexible circuit board 5 is bonded with the bonding wiring of the metal wiring 3 on the lateral surface of the display module 200. The remote end of the flexible circuit board 5 is provided with a driving chip 6 and a control chip. The other side of the flexible circuit board 5 is fixed with the PCB, so that the input and output of signals of the display module 200 can be realized.

Ninth step: at least two of the display modules 200 are provide and spliced with each other to achieve a seamless splicing display device 300. Next, by the signal synchronization processing of the system, the missing image in the black bezel around the display module 200 is displayed by the small-sized light-emitting units 22 of the compensation display component 2, so as to realize the real seamless display effect.

In the present embodiment, the distance between the centers of the two of the small-sized light-emitting units 22 closest to the bezel area NA of the two of the spiced display modules 200 is P3, and P3=P1. That is, the distance between the small-sized light-emitting units 22 in the bezel area NA is equal to the distance between the centers of the pixel units 110 in the central display area AA of the display panel 1. In other words, by making the pixel spacing of the display module 200 equal to the spacing of the LEDs included in the small-sized light-emitting units 22 in the bezel area NA, the image transition tends be natural, and the real seamless splicing with the same spacing can be realized.

In summary, in the display modules 100 and 200 and the seamless splicing display device 300 formed of the display modules 200 disclosed in the present disclosure, the compensation display component 2 is disposed in the bezel area NA of the display panel 1, and the bezel driving circuit 101 configured for controlling the display of the compensation display component is disposed on the array substrate 10. That is, the array substrate driving circuit 103 and the bezel driving circuit 101 are integrated, so that the control circuit structure of the display modules 100 and 200 can be simplified. The thickness of the compensation display component 2 on the bezel area NA of the display panel 1 is only the thickness of the light-emitting units, and it is unnecessary to dispose an additional circuit board to control it, so that the thickness of the display modules 100 and 200 can be further reduced. Since the compensation display component 2 is formed by surface-mount technology, the attachment deviation can be further reduced. In this way, there is also no requirement for narrowing the bezel of the display panel 1, so that the bezel design of the display panel 1 is simplified.

To sum up, although the present disclosure has been described with the preferred embodiment, the preferred embodiment is not intended to limit the present disclosure. For a person of ordinary skill in the art, equivalent replacements or changes can be made without departing from the scope and the spirit of the disclosure that is intended to be limited only by the appended claims.

What is claimed is:

1. A display module, comprising:
   a display panel comprising a central display area and a bezel area adjacent to the central display area, wherein the display panel is provided with a bezel driving circuit and an array substrate driving circuit, wherein the display panel comprises an array substrate and a color film substrate disposed opposite the array substrate;
   a compensation display component disposed on the display panel, located in the bezel area, and electrically connected with the bezel driving circuit; and
   a metal wiring located on a lateral surface of the display panel and connected with the bezel driving circuit and the array substrate driving circuit,
   wherein the bezel driving circuit comprises a driving part configured for driving the compensation display component and an electrically-conductive lead connected with the compensation display component, one end of the metal wiring is connected with the electrically-conductive lead, and the other end of the metal wiring is connected with the driving part, wherein the bezel driving circuit and the array substrate driving circuit are integrated,
   wherein the bezel driving circuit extends to and is aligned with the lateral surface of the display panel, the driving part extends to a lateral surface of the array substrate, and the driving part is disposed on one side of the array substrate facing the color film substrate.

2. The display module according to claim 1, wherein the compensation display component and the electrically-conductive lead are disposed on an outer surface of the color film substrate away from the array substrate, and the array substrate driving circuit is disposed on one side of the array substrate facing the color film substrate.

3. The display module according to claim 2, wherein the compensation display component comprises a plurality of small-sized light-emitting units and a plurality of sets of positive and negative electrodes, the plurality of small-sized light-emitting units and the plurality of sets of positive and negative electrodes are disposed in the bezel area, each of the small-sized light-emitting units is connected with one of the sets of positive and negative electrodes, and each of the sets of positive and negative electrodes is electrically connected to the electrically-conductive lead.

4. The display module according to claim 3, wherein the display panel comprises a plurality of pixel units, a distance between centers of the adjacent pixel units is P1, a distance between one of the small-sized light-emitting units and the pixel unit closest to the central display area is P2, and P2=P1.

5. The display module according to claim 2, wherein a black matrix layer is disposed on a surface of the color film substrate close to the array substrate, the black matrix layer is located in the bezel area, and an orthogonal projection of the compensation display component projected on the color film substrate is within an orthogonal projection of the black matrix layer projected on the color film substrate.

6. The display module according to claim 1, wherein the metal wiring is L-shaped, and the metal wiring extends from the lateral surface of the display panel to a surface of the electrically-conductive lead.

7. The display module according to claim 6, wherein the display module comprises a shielding layer, the metal wiring is divided into a bonding wiring and a non-bonding wiring, and the shielding layer is disposed on a surface of the non-bonding wiring of the metal wiring.

8. The display module according to claim 7, wherein the display module comprises a flexible circuit board and a driving chip, a portion of the flexible circuit board is disposed on one side of the metal wiring away from the display panel and electrically connected with the bonding wiring, and another portion of the flexible circuit board is disposed on one side of the display panel away from the compensation display component and is electrically connected with the driving chip.

9. The display module according to claim 8, wherein the display module comprises a protective layer, the protective layer covers a part of a surface of the flexible circuit board.

10. The display module according to claim 7, wherein the shielding layer is black.

11. A seamless splicing display device comprising at least two display modules which are spliced together, wherein one of the at least two display module comprises:
    a display panel comprising a central display area and a bezel area adjacent to the central display area, wherein the display panel is provided with a bezel driving circuit and an array substrate driving circuit, wherein the display panel comprises an array substrate and a color film substrate disposed opposite the array substrate;
    a compensation display component disposed on the display panel, located in the bezel area, and electrically connected with the bezel driving circuit; and a metal wiring located on a lateral surface of the display panel and connected with the bezel driving circuit and the array substrate driving circuit, wherein the bezel driving circuit comprises a driving part configured for driving the compensation display component and an electrically-conductive lead connected with the compensation display component, one end of the metal wiring is connected with the electrically-conductive lead, and the other end of the metal wiring is connected with the driving part, wherein the bezel driving circuit and the array substrate driving circuit are integrated, wherein the bezel driving circuit extends to and is aligned with the lateral surface of the display panel, the driving part extends to a lateral surface of the array substrate, and the driving part is disposed on one side of the array substrate facing the color film substrate.

12. The seamless splicing display device according to claim 11, wherein the compensation display component and the electrically-conductive lead are disposed on an outer surface of the color film substrate away from the array substrate, and the array substrate driving circuit is disposed on one side of the array substrate facing the color film substrate.

13. The seamless splicing display device according to claim 12, wherein the compensation display component comprises a plurality of small-sized light-emitting units and a plurality of sets of positive and negative electrodes, the plurality of small-sized light-emitting units and the plurality of sets of positive and negative electrodes are disposed in the bezel area, each of the small-sized light-emitting units is connected with one of the sets of positive and negative electrodes, and each of the sets of positive and negative electrodes is electrically connected to the electrically-conductive lead.

14. The seamless splicing display device according to claim 13, wherein the display panel comprises a plurality of pixel units, a distance between centers of the adjacent pixel units is P1, a distance between one of the small-sized light-emitting units and the pixel unit closest to the central display area is P2, and P2=P1.

15. The seamless splicing display device according to claim 13, wherein a black matrix layer is disposed on a surface of the color film substrate close to the array substrate, the black matrix layer is located in the bezel area, and an orthogonal projection of the compensation display component projected on the color film substrate is within an orthogonal projection of the black matrix layer projected on the color film substrate.

16. The seamless splicing display device according to claim 12, wherein the metal wiring is L-shaped, and the metal wiring extends from the lateral surface of the display panel to a surface of the electrically-conductive lead.

17. The seamless splicing display device according to claim 11, wherein the display module comprises a shielding layer, the metal wiring is divided into a bonding wiring and a non-bonding wiring, and the shielding layer is disposed on a surface of the non-bonding wiring of the metal wiring.

18. The seamless splicing display device according to claim 16, wherein the seamless splicing display device comprises a flexible circuit board, a driving chip, and a protective layer, a portion of the flexible circuit board is disposed on one side of the metal wiring away from the display panel and electrically connected with the bonding wiring, another portion of the flexible circuit board is disposed on one side of the display panel away from the compensation display component and is electrically connected with the driving chip, and the protective layer covers a part of a surface of the flexible circuit board and is sandwiched between the adjacent two of the display modules.

19. The seamless splicing display device according to claim 18, wherein the protective layer is a combination of an adhesive layer and a protective film, and the adhesive layers included in the protective layers on surfaces of the flexible circuit boards included in the spliced two of the display modules are bonded to each other.

20. The seamless splicing display device according to claim 11, wherein the display panel comprises a plurality of pixel units, a distance between centers of the adjacent pixel units is P1, and a distance between centers of the compensation display components on the adjacent two of the display modules is P3, wherein P3=P1.

* * * * *